(12) United States Patent
Rotbard et al.

(10) Patent No.: US 9,898,059 B2
(45) Date of Patent: Feb. 20, 2018

(54) DYNAMIC CONTROL OF POWER CONSUMPTION BASED ON MEMORY DEVICE ACTIVITY

(71) Applicant: APPLE INC., Cupertino, CA (US)

(72) Inventors: Barak Rotbard, Tel Aviv (IL); Assaf Shappir, Ganey Tikva (IL)

(73) Assignee: APPLE INC., Cupertino, CA (US)

( * ) Notice: Subject to any disclaimer, the term of this patent is extended or adjusted under 35 U.S.C. 154(b) by 29 days.

(21) Appl. No.: 15/220,411

(22) Filed: Jul. 27, 2016

(65) Prior Publication Data

US 2017/0262033 A1 Sep. 14, 2017

Related U.S. Application Data

(60) Provisional application No. 62/307,500, filed on Mar. 13, 2016.

(51) Int. Cl.
- *G06F 1/26* (2006.01)
- *G06F 1/32* (2006.01)
- *G06F 3/06* (2006.01)
- *G11C 16/30* (2006.01)

(52) U.S. Cl.
CPC ............ *G06F 1/263* (2013.01); *G06F 1/3225* (2013.01); *G06F 3/0634* (2013.01); *G11C 16/30* (2013.01)

(58) Field of Classification Search
CPC ...... G06F 1/263; G06F 1/3225; G06F 3/0634; G11C 16/30
See application file for complete search history.

(56) References Cited

U.S. PATENT DOCUMENTS

| | | | |
|---|---|---|---|
| 6,240,027 B1 | 5/2001 | Lee et al. | |
| 6,597,603 B2 | 7/2003 | Lambrache et al. | |
| 7,062,599 B2 | 6/2006 | Piatilli | |
| 9,009,517 B2 * | 4/2015 | Mayer | G06F 1/32 713/340 |
| 9,037,890 B2 * | 5/2015 | De Caro | G06F 1/3275 711/103 |
| 9,042,180 B2 * | 5/2015 | Tanzawa | G11C 16/30 324/762.01 |

* cited by examiner

Primary Examiner — Stefan Stoynov
(74) Attorney, Agent, or Firm — D. Kligler IP Services Ltd.

(57) ABSTRACT

A memory controller includes an interface and a processor. The interface is configured to communicate with one or more memory devices that require an operation voltage. The memory devices are capable of obtaining the operation voltage either from a power supply external to the memory device or from respective charge pumps internal to the memory devices. The processor is configured to predict storage activity in the memory devices, and to cause the memory devices to select a source for the operation voltage between the power supply and the respective charge pumps in accordance with the predicted storage activity.

20 Claims, 3 Drawing Sheets

DYNAMIC CONTROL OF POWER CONSUMPTION BASED ON MEMORY DEVICE ACTIVITY

CROSS-REFERENCE TO RELATED APPLICATIONS

This application claims the benefit of U.S. Provisional Patent Application 62/307,500, filed Mar. 13, 2016, whose disclosure is incorporated herein by reference.

TECHNICAL FIELD

Embodiments described herein relate generally to data storage, and particularly to methods and systems for dynamic alternation between an external power supply and an internal charge pump.

BACKGROUND

Various storage systems comprise a controller that stores data in one or more memory devices. Certain storage operations such as program and erase operations require a high operating voltage, e.g., on the order of 12V, which may be provided to the memory devices from an external power supply. Alternatively, the memory devices may comprise an internal charge pump that converts a low voltage input to the required high operating voltage.

Memory devices comprising a charge pump are known in the art. For example, U.S. Pat. No. 6,597,603, whose disclosure is incorporated herein by reference, describes a dual mode high voltage power supply circuit using an external high voltage connected through an internal high voltage switch, which determines whether the memory blocks of a non-volatile memory circuit are programmed in a first mode from an internal high voltage charge pump or are programmed in a second mode from an external high voltage power supply connected in parallel to the internal high voltage charge pump.

U.S. Pat. No. 6,240,027, whose disclosure is incorporated herein by reference, describes a chip containing a Flash memory in which external high voltages are connected to selected cells to be erased. Internal pump circuits contained on the chip are turned off while the external voltages are used. The external voltages, a high negative voltage and a high positive voltage, are connected to gates and sources respectively of selected cells to be erased by a voltage control module. The external voltages are used during manufacture during program/erase operations to perform the erase function efficiently. The internal high voltage pump circuits are used to erase flash memory cells after being assembled on a circuit board by a user.

SUMMARY

An embodiment that is described herein provides a memory controller that includes an interface and a processor. The interface is configured to communicate with one or more memory devices that require an operation voltage. The memory devices are capable of obtaining the operation voltage either from a power supply external to the memory device or from respective charge pumps internal to the memory devices. The processor is configured to predict storage activity in the memory devices, and to cause the memory devices to select a source for the operation voltage between the power supply and the respective charge pumps in accordance with the predicted storage activity.

In some embodiments, the processor is configured to cause a given memory device to select the source by controlling a switch in the given memory device to output a first voltage provided by the power supply or a second voltage generated by a charge pump of the given memory device. In other embodiments, the processor is configured to predict the storage activity by evaluating expected durations of imminent transactions between the memory controller and the memory devices, and to cause the memory devices to respectively select the source for the operation voltage based on the expected durations. In yet other embodiments, the processor is configured to cause the memory devices to select the charge pumps when the respective expected durations are shorter than a predefined duration threshold, and to cause the memory devices to select the power supply when the respective expected durations exceed the duration threshold.

In an embodiment, the memory interface is further configured to exchange control signaling with the power supply, and the processor is configured to control a power dissipation level in the power supply depending on the predicted storage activity. In another embodiment, the processor is configured to control the power dissipation level by shutting down the power supply when the memory devices select the charge pumps. In yet another embodiment, the processor is configured to control the power supply to disconnect a high-power Vpp voltage from the memory devices and to set the power supply to a high-ripple mode of operation in which the power supply consumes a reduced amount of power.

In some embodiments, the processor is configured to check a switching rate of the power supply resulting from the storage activity, and, when the switching rate exceeds a predefined threshold rate, to operate the power supply in a low-power mode in which the power supply is incapable of driving all the memory devices at full power demand, and to cause one or more of the memory devices to select the charge pumps. In other embodiments, the processor is configured to cause a given memory device to select the source based on the predicted storage activity in the given memory device, and independently of the predicted storage activity in other memory devices. In yet other embodiments, the processor is configured to cause a given memory device to select the source based on the predicted storage activity in one or more other memory devices.

There is additionally provided, in accordance with an embodiment that is described herein, a method including, in a controller communicating with one or more memory devices that require an operation voltage, wherein each of the memory devices is capable of obtaining the operation voltage either from a power supply external to the memory device or from respective charge pumps internal to the memory devices, predicting storage activity in the memory devices. The memory devices are caused, by the memory controller, to select a source for the operation voltage between the power supply and the respective charge pumps in accordance with the predicted storage activity.

These and other embodiments will be more fully understood from the following detailed description of the embodiments thereof, taken together with the drawings in which:

DETAILED DESCRIPTION OF EMBODIMENTS

Overview

Figure 1:
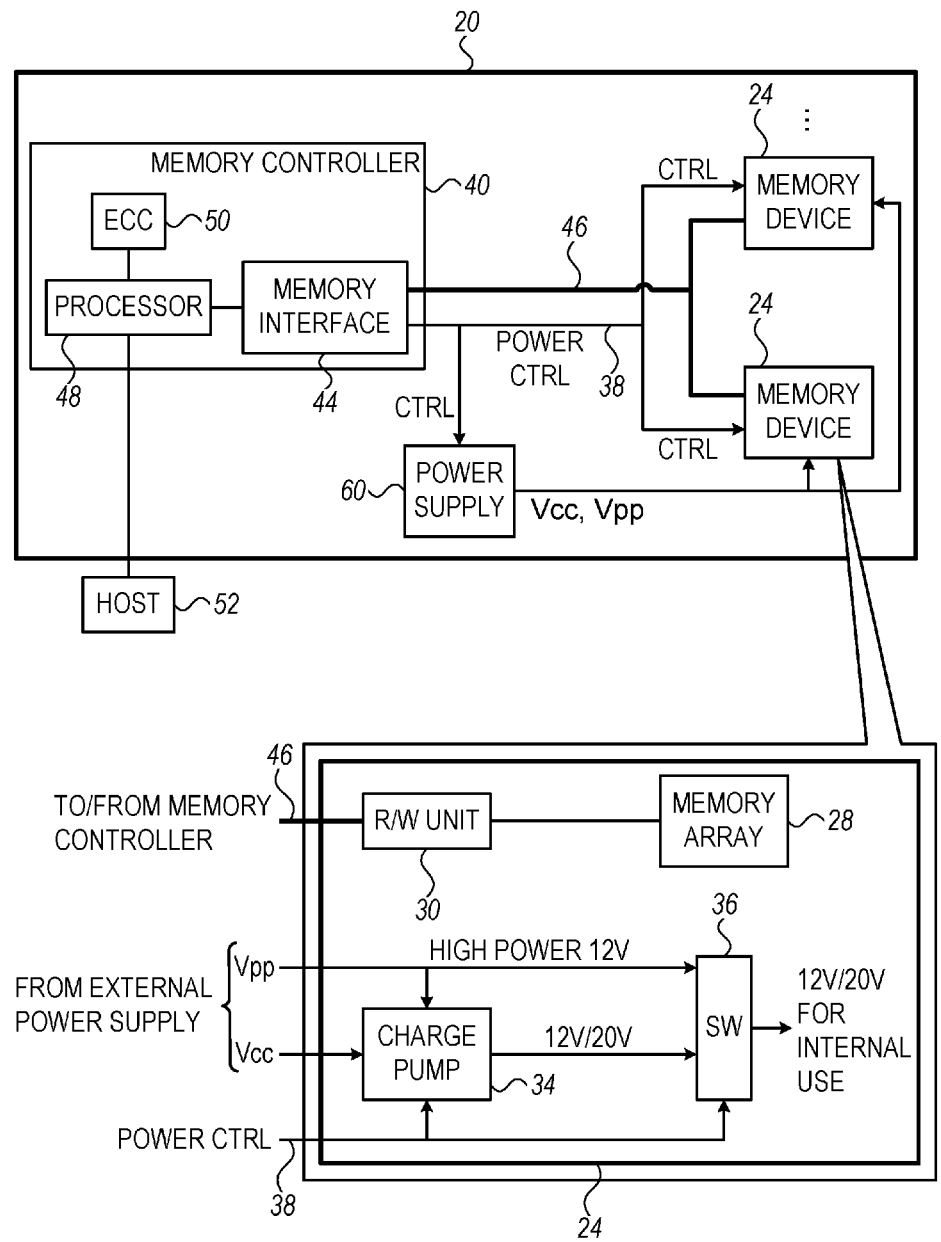
FIG. 1 is a block diagram that schematically illustrates a memory system, in accordance with an embodiment that is described herein.

Memory devices typically require a high operating voltage to carry out storage operations such as programming, erasure and readout. This high operating voltage is typically much higher than the normal power supply voltage (which is typically on the order of 3V). For example, NAND Flash memory typically employs voltages on the order of 20V for programming and erasure, and on the order of 12V for inhibit and pass-through. These values are not necessarily constant and can vary according to the specific implementation and technology generation of the NAND die. For example, a programming operation may employ a program-and-verify algorithm, with the high voltage gradually being increased from 18V to above 20V. Some types of memory devices are equipped with an internal charge pump that converts a low voltage input (e.g., on the order of 3V) to the required high operating voltages.

Some storage systems comprise a power supply that can provide a high operating voltage of 12V to the memory devices, to be used instead of or in conjunction with the internal charge pumps. The power supply, however, consumes battery power and creates heat, and is therefore more suitable for use in power-insensitive applications, such as during offline testing. The power supply 12V output is also denoted Vpp.

Embodiments that are described herein provide methods and systems for dynamically alternating between an external power supply and the charge pump output of the memory device, based on the memory device's activity. In the disclosed techniques, although the external power supply can be made available at all times, it may be beneficial in certain scenarios to shut the external power supply down and to use the internal charge pumps instead.

The strategy for dynamically selecting between the external power supply and the charge pumps aims to minimize the overall power consumed by the power supply and the memory devices. For example, the Vpp in the external power supply may be shut down during storage operations that the memory device can execute using the internal charge pumps, and activated only when the internal charge pumps are incapable of delivering the required power demand. In addition, in some scenarios, such as in periods during which the memory devices are powered from the external Vpp, one or more of the pumping stages within the charge pumps may be switched off, to save power.

In some embodiments, the memory controller causes a given memory device to select the high operating voltage source based on the predicted storage activity in the given memory device, and independently of the predicted storage activity in other memory devices. In alternative embodiments, the memory controller causes a given memory device to select the high operating power source based on the predicted storage activity in one or more other memory devices.

The disclosed embodiments refer to a storage system comprising a memory controller that stores data in one or more memory devices. Each of the memory devices can be configured by the memory controller to generate a high operating voltage using an internal charge pump, or alternatively to use a high voltage input provided by an external power supply. Since the memory controller has knowledge of current and imminent storage operations and of the power consumption incurred by executing these storage operations, the memory controller can cause the memory devices to select between the power supply and the charge pumps based on predicted activity of the memory devices.

The activity profile of the memory devices is indicative of the power demand of the memory devices and depends on various factors. For example, the level of activity may depend on the type of storage operations applied, and on the number of memory devices or cell-groups to which the storage operations are applied in parallel. The activity profile also refers to time-dependence characteristics of applying the storage operations.

For example, short duration storage operations typically consume less power than long duration operations. Therefore, in an embodiment, when a memory device is required to execute a given storage operation, the memory controller configures this memory device to use its internal charge pump or the external Vpp input depending on the expected duration of the storage operation. The duration of a storage operation can be defined in time units or in terms of the amount of data involved. As another example, when a memory device is idle and performs no storage operations, the memory device consumes very little power, and therefore the memory controller may save power by shutting down the external Vpp source, and possibly also the internal charge pump of the memory device.

In some embodiments, the memory controller re-activates the Vpp of the external power supply well before Vpp is actually needed by the memory devices, and delays the execution of the respective storage operations until the Vpp voltage is stabilized and ready for use. In other embodiments, for fast response, the memory devices start executing the storage operations with the high operating voltage provided by the internal charge pump, and when Vpp is up and stabilized, the memory controller engages the Vpp voltage to the power supply output and switches the memory devices to use the external Vpp.

Switching the Vpp voltage on and off in the power supply results in charging and discharging of various capacitive elements, which causes undesirable power dissipation. Typically, frequent on-and-off switching causes high power dissipation. In some embodiments, the memory controller takes into consideration the power dissipation caused by switching the Vpp voltage on and off, in addition to the power consumed by the memory devices. In an example embodiment, the memory controller configures the memory devices to use the internal charge pumps and shuts the external Vpp down when the Vpp switching rate is above a predefined threshold rate, and configures the power supply to output Vpp and the memory devices to use the external Vpp when the switching rate is lower than the threshold rate.

In some embodiments, the power supply can be configured to a low-power mode of operation. In this mode the power supply outputs Vpp but can drive only a subset (and not all) of the memory devices. In an embodiment, the memory controller configures one or more of the memory devices, e.g., those having high activity level, to use the external Vpp and also configures the remaining memory devices to use their internal charge pumps. In other embodiments, when configured to the low-power mode, the power supply is able to drive all of the memory devices simultaneously, e.g., in case at least one of the memory devices is idle or executes a storage operation of low power demand, such as a reading operation.

In some embodiments, when Vpp is not engaged to the power supply output, the memory controller configures the power supply to a high-ripple mode of operation in which the power supply incurs little power dissipation.

In the disclosed techniques, the memory controller reduces the overall power consumption by dynamically controlling the memory devices to select between the external Vpp or the internal charge pump as the high operating voltage source. The selection is based on imminent storage activity in the memory devices. In certain scenarios, additional reduction in power consumption and heat dissipation are achievable using efficient operating modes in the power supply and charge pumps.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

System 20 comprises memory devices 24, each stores data in a memory cell array 28, which comprises multiple memory cells (not shown in the figure) such as analog memory cells. In the context of the present patent application, the term "analog memory cell" is used to describe any memory cell that holds a continuous, analog value of a physical parameter, such as an electrical voltage or charge. Array 28 may comprise solid-state memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

System 20 stores data in the memory cells by programming the cells to assume respective memory states, which are also referred to as programming levels. The programming levels are selected from a finite set of possible levels, and each level corresponds to a certain nominal storage value. For example, a 2 bit/cell Multi-Level Cell (MLC) can be programmed to assume one of four possible programming levels by writing one of four possible nominal storage values into the cell.

Each of memory devices 24 comprises a reading/writing (R/W) unit 30, which converts data for storage in the memory device to analog storage values and writes them into the memory cells. In alternative embodiments, the RW unit does not perform the conversion, but is provided with voltage samples, i.e., with the storage values for storage in the memory cells. When reading data out of array 28, R/W unit 30 converts the storage values of the memory cells into digital samples having an integer resolution of one or more bits. Data is typically written to and read from the memory cells in groups that are referred to as pages. In some embodiments, the R/W unit can erase a group of memory cells by applying one or more negative erasure pulses to the cells. Erasing of cells is usually carried out in blocks that contain multiple pages.

The storage and retrieval of data in and out of memory devices 24 is performed by a memory controller 40. Memory controller 40 comprises an interface 44 for communicating with memory devices 24 over a bus 46, a processor 48, and an Error Correcting Code (ECC) unit 50. Bus 46 may comprise any suitable link or bus such as a parallel bus or a serial bus, or a packet-based bus such as PCIe. Bus 46 may operate in accordance with any suitable standard or protocol, and at any suitable rate.

The disclosed techniques can be carried out by memory controller 40, by R/W unit 30, or both. Thus, in the present context, memory controller 40 and R/W unit 30 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used.

Memory devices 24 in system 20 require various operating voltages, including one or more high operating voltages, to carry out storage operations such as programming and erasure. A reading operation typically requires a lower operating voltage than programming and erasure. For example, in some embodiments, programming and erasure operations require a 20V operating voltage, whereas read operations require a 12V operating voltage.

Memory system 20 comprises a power supply 60, which provides one or more voltages to memory devices 24 and possibly to memory controller 40 (not shown in the figure.) In the present example, power supply 60 provides two voltages to the memory devices, i.e., a Vcc=3V voltage and a Vpp=12V voltage. In alternative embodiments, Vcc and Vpp of other suitable voltage values can also be used. Further alternatively, a power supply that outputs any other suitable number of voltages having suitable respective voltage values can also be used.

In system 20, each memory device 24 comprises a charge pump module 34 that converts a low voltage input such as Vcc to a high operating voltage. The charge pump can be configured to generate a high operating voltage, e.g., 12V, 18V or 20V, depending on the underlying operation to be executed by the memory device. In the example of FIG. 1, for the sake of clarity, the charge pump outputs only 12V or 20V. Memory device 24 comprises a switch 36, which delivers for internal use either the external Vpp or the output of charge pump 34.

In a typical implementation, charge pump 34 comprises multiple pumping stages in a serial configuration, wherein each stage pumps its input up by approximately Vcc volts (or by any other suitable voltage step.) In an embodiment, when the external Vpp from power supply 60 is unavailable, e.g., because the power supply is shut down or disconnected, the controller configures charge pump 34 to generate a required high operating voltage output from the Vcc input.

In some embodiments, when the external Vpp is available, the controller configures charge pump 34 to generate the high operating voltage from the external Vpp rather than from the external Vcc input, which requires less pumping stages and therefore the charge pump consumes less power. This mode of operation is useful, for example, when the power supply operates at a low-power mode in which the power supply cannot derive all of the memory devices at full power demand, and therefore configures one or more memory devices consuming less power to use their internal charge pumps.

In alternative embodiments, charge pump 34 generates only a 12V output, and an additional charge pump, e.g., at the output of switch 36 (not shown in the figure) converts the 12V at the switch output to some high operating voltage, e.g., 20V, as appropriate.

In some embodiments, in certain scenarios in which the external Vpp is available, the controller configures the memory devices to use the external Vpp, and possibly switches charge pumps 34 off in one or more of the memory devices to save power. For example, the memory controller switches off the charge pump in memory devices that execute read operations. Alternatively or additionally, the controller configures the memory devices to use the external Vpp for the Vpass voltage required for programming, instead of using charge pump 34, and therefore can switch the charge pump off to save power.

In the configuration of FIG. 1, voltages up to 12V can be derived directly from the external Vpp source with no further voltage pumping, whereas the generation of voltages above 12V, e.g., 20V (or any other suitable voltage such as 18V or 21V) requires the use of charge pump 34, possibly in combination with the external Vpp, when available, for increased efficiency.

In the example of system 20, memory controller 40 controls memory device 24 using a control signal 38 denoted POWER CTRL. In some embodiments, control signal 38 controls the state of switch 36 so as to output the external Vpp or the output of charge pump 34 as the high operational voltage. Alternatively or additionally, control signal 38 controls the operation of charge pump 34. For example, when the external Vpp input is available, the memory controller can configure control signal 38 to shut the charge pump (or some of its pumping stages) down, as described above. Further alternatively, charge pump 34 and switch 36 may operate as a unified module that automatically selects the external Vpp input or the charge pump output depending on whether or not the external Vpp voltage is available.

In some embodiments, memory interface 44 operates on a dedicated voltage that is typically on the order of 1.8V, although other suitable voltages can also be used. In some embodiments, power supply 60 provides the 1.8V voltage for operating memory interface 44. In other embodiments, the 1.8V voltage is produced within system 20 or memory controller 40 from a higher voltage, e.g., from the 12V Vpp provided by power supply 60.

In some embodiments, power supply 60 supports multiple operating modes, which are configurable by controller 40, e.g., using control signal 38. For example, controller 40 may set Vpp in the power supply on and off, providing 12V or 0V, respectively, at the power supply output. Alternatively, when switching Vpp off, the respective output of the power supply is disconnected.

In some embodiments, the memory controller configures power supply 60 to a low-power mode, in which the power supply consumes little power, thus saving battery power, and reduces heat and power dissipation. In the low-power mode, however, the power supply can derive Vpp to only a limited number of the memory devices demanding full power.

In the disclosed embodiments, the controller dynamically controls the operation of the power supply and the selection of the external Vpp or the output of the charge pump within the memory devices, based on the current and predicted activity of the memory devices. Example relevant embodiments are described further below.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows two memory devices, in alternative embodiments memory controller 40 may control a single memory device, or more than two memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory devices 24 and memory controller 40 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory arrays are disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Methods for Dynamic Power Control

In system 20, the memory devices can use a high operating voltage that is generated internally using charge pump 34 or an external Vpp voltage provided by power supply 60. Note that even though the external Vpp source can be made available at all times, it may be advantageous to use the internal charge pump instead, in certain scenarios. In the disclosed embodiments, the memory controller predicts the imminent storage activity in the memory devices, and configures the memory devices to use the external Vpp of the power supply or the output of the internal charge pump as a high operating voltage based on certain characteristics of the expected activity, as will be described below.

Figure 2:
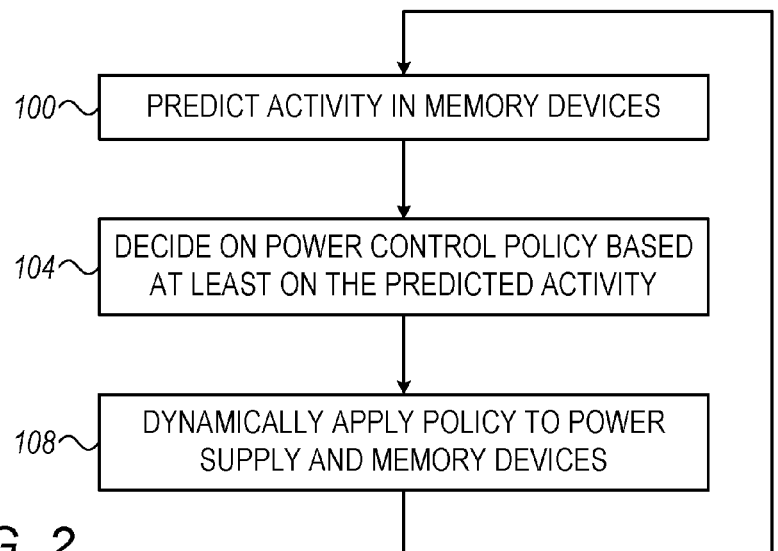
FIG. 2 is a flow chart that schematically illustrates a method for controlling the power consumption of a memory system based on predicted memory activity, in accordance with an embodiment that is described herein.

FIG. 2 is a flow chart that schematically illustrates a method for controlling the power consumption of memory system 20 based on a predicted memory activity, in accordance with an embodiment that is described herein. The method may be executed, for example, by controller 40 of memory system 20 above.

The method begins with memory controller 40 predicting the activity level in memory devices 24, at a predicting step 100. The activity level of the memory devices is indicative of the power consumed by the memory devices and may depend on various factors. For example, programming and erasure operations typically consume higher amounts of power than read operations. In addition, a memory device in idle, i.e., performing no storage operations, typically consumes very little power. As another example, a programming or erasure operation applied to multiple memory devices in parallel corresponds to a higher activity level (and therefore consumes more power) than a similar operation applied to a single memory device.

An activity profile of the memory devices may comprise, for example, dynamic or time-varying characteristics of the activity in the memory devices. For example, periods of high activity may correspond to programming large amounts of data to the memory devices, and low activity periods may correspond to scenarios in which some or all of the memory devices are in idle. In the disclosed embodiments, since the memory controller schedules the storage operations in the memory devices, the memory controller has knowledge of the current and future activities in the memory devices and of the time-dependence characteristics of this activity.

At a policy decision step 104, the memory controller decides on a preferred power control policy, based on the predicted activity assessed at step 100. The memory controller may use any suitable method for deciding on the power control policy. In some embodiments, the power control policy depends on the expected activity level relative to a predefined threshold level.

In an example embodiment, when the predicted activity level reduces below the threshold level, the memory controller configures the memory devices to use their internal charge pumps and to shut down the Vpp voltage in power supply 60. Such a strategy prevents unnecessary power dissipation in the power supply when not in use. When the expected activity level exceeds the threshold level, the memory controller activates the Vpp voltage in power supply 60 and configures the memory devices (e.g., by applying control signal 38 to the power supply and switch 36) to use the external Vpp instead of using the internal charge pump.

In some embodiments, instead of shutting Vpp down, the memory controller configures power supply 60 to a low-power consumption mode. In this mode, Vpp is available at the power supply output, but can be used by only a subset of the memory devices, simultaneously. In an embodiment, the memory controller configures the power supply to the low-power mode, and further configures one or more (but not all) of the memory devices, e.g., those having high activity, to use the external Vpp, and configures the remaining memory devices to use the internal charge pump.

In one embodiment, the memory controller decides on a power control policy based on the expected durations of high level and low level activities of the memory devices. In another embodiment, the controller decides on a policy that takes into consideration the switching profile of Vpp in power supply 60. Embodiments of this sort are described in detail below.

At a policy application step 108, the memory controller applies the power control policy of step 104 to memory devices 24, to power supply 60 or both. The method then loops back to step 100 to further predict the activity level and adjusting the power control policy accordingly.

Figure 3:
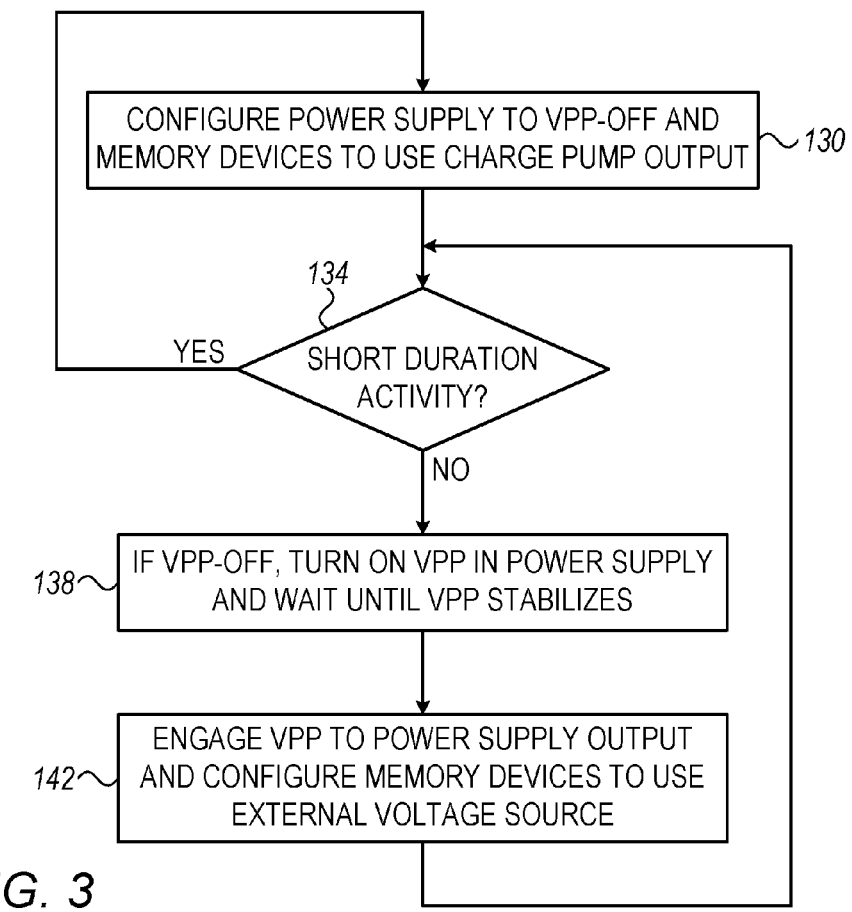
FIG. 3 is a flow chart that schematically illustrates a method for controlling the power consumption of a memory system based on transaction duration, in accordance with an embodiment that is described herein.

FIG. 3 is a flow chart that schematically illustrates a method for controlling the power consumption of memory system 20 based on transactions duration, in accordance with an embodiment that is described herein. In the present context, a transaction refers to a storage operation in which data is transferred between the controller and memory devices via interface 44.

The method begins with memory controller 40 shutting Vpp down in power supply 60 at a low-power mode setting 130. At step 130 the memory controller additionally configures memory devices 24 to use their internal charge pumps for providing the 12V high operating voltage.

At a transaction duration checking step 134, the memory controller evaluates the expected duration of an imminent transaction between the memory controller and the memory devices. In some embodiments, the transaction duration is defined in terms of the amount of data transferred. When the expected duration at step 134 is shorter than a predefined threshold duration, the internal charge pumps (which are currently provide the high operating voltage) are sufficient for performing the corresponding storage operations, and the method loops back to step 130. Otherwise, the corresponding storage operations require the 12V voltage for a relatively long period, and the memory controller proceeds to a power supply activation step 138.

Typically, there is some delay between the activation time of Vpp in power supply 60 and the operational time at which the Vpp is actually up and ready for use by the memory devices. In some embodiments, at step 138, the memory controller activates Vpp and waits a predefined delay for Vpp to stabilize. In an embodiment, during this delay, the memory controller initiates storage operations that the memory devices can execute using the internal charge pumps, thus avoiding unnecessary delay in executing these storage operations. At an engagement step 142, Vpp has already stabilized and the controller signals the power supply (e.g., using the control signal 38) to engage Vpp to the power supply output to be used by memory devices 24, and configures the memory devices to use the external Vpp.

In some embodiments, when Vpp is up but is not engaged to the power supply output, the memory controller may configure the power supply to an efficient high-ripple low-power mode of operation. In this mode Vpp is not provided to the power supply output, and therefore Vpp is allowed a voltage ripple level that is higher than tolerable by the memory devices. By relaxing the voltage ripple requirements, the efficiency of the power supply increases and its power dissipation is reduced. Moreover, transferring the power supply from the high-ripple low-power mode to operating at full power and low ripple is faster than switching Vpp up from a shutdown state.

Figure 4:
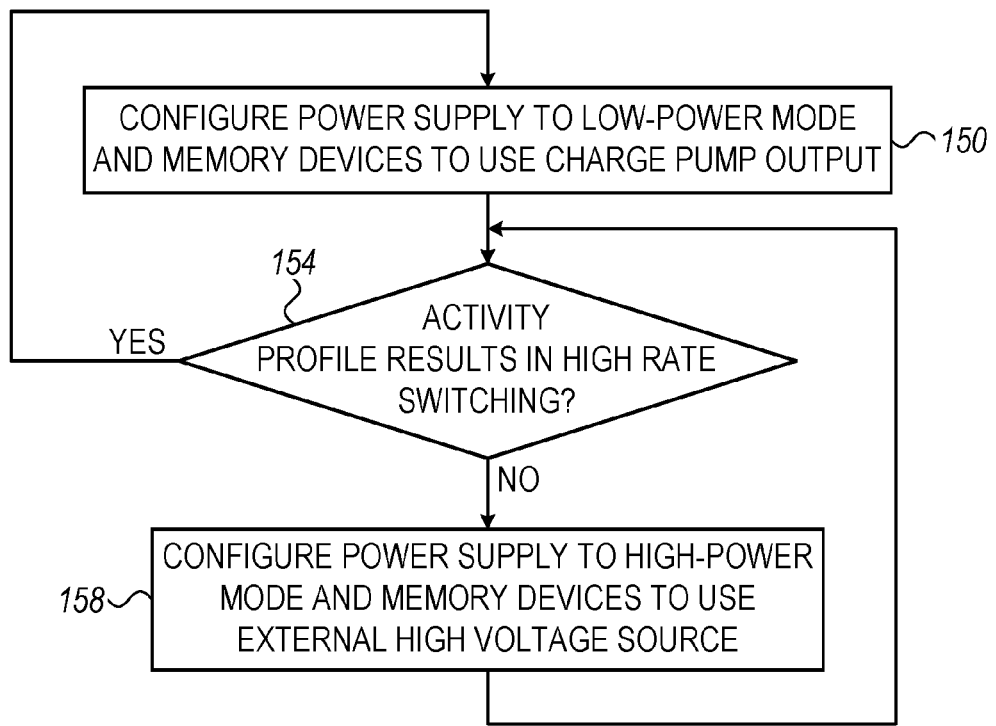
FIG. 4 is a flow chart that schematically illustrates a method for controlling the power consumption of a memory system based on an operating voltage switching profile, in accordance with an embodiment that is described herein.

FIG. 4 is a flow chart that schematically illustrates a method for controlling the power consumption of memory system 20 based on an operating voltage switching rate, in accordance with an embodiment that is described herein. The method takes into consideration scenarios in which frequent on-and-off switching of the Vpp voltage in power supply 60 may cause large power dissipation due to charging and discharging of various capacitive elements.

The method begins with memory controller 40 configuring power supply 60 to a low-power mode of operation, at a low-power setting step 150. In this low-power mode of operation the power supply provides a low-ripple Vpp voltage to its output, which is different from the high-ripple low-power mode described above. At step 150 the memory controller additionally configures the memory devices to use their internal charge pumps for providing the 12V operating voltage. Alternatively, the memory controller configures at least one of the memory devices, e.g., those devices in which the expected activity is relatively high, to use the external Vpp from power supply 60.

In some embodiments, when configured to the low-ripple low-power mode, the power supply is able to drive all of the memory devices simultaneously, e.g., provided that not all of the memory devices execute storage operations of high power demand. For example, at least some of the memory devices may be idle, or execute low-power storage operations such as reading operations.

At a switching profile checking step 154, the memory controller evaluates the expected rate at which the Vpp voltage in the power supply is switched on and off, based on the dynamic activity profile of the memory devices. When at step 154 the Vpp on-and-off switching rate exceeds a predefined threshold rate, the method loops back to step 150 so that the overall power consumption of the power supply and memory devices is lowered by avoiding frequent on/off switching of Vpp in the power supply. Otherwise, the on/off switching rate of Vpp is sufficiently low and the method proceeds to a high-power mode setting step 158. At step 158 the memory controller configures the power supply to operate at a full power mode in which Vpp can derive all memory devices 24. In addition, the memory controller configures the memory devices to use the external Vpp voltage instead of their internal charge pumps. The method then loops back to step 154 to re-evaluate the on/off Vpp switching profile.

The embodiments described above are given by way of example, and other suitable embodiments can also be used. For example, although in the described embodiments, we refer mainly to a storage system in which the external Vpp is provided to all the memory devices from a single power supply, in alternative embodiments, multiple power supplies, each deriving Vpp to one or more respective memory devices can be used. In such configurations, the memory controller has greater flexibility in applying power control policies.

In the above disclosed embodiments, managing the system power consumption can be performed by any module within the memory controller, by a host communicating with the memory controller, or in combination of both the host and memory controller. For example, the disclosed techniques may be executed by a Flash Translation Layer (FTL) in the memory controller.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory controller, comprising:
an interface, which is configured to communicate with one or more memory devices that require an operation voltage, wherein the memory devices are capable of obtaining the operation voltage either from a power supply external to the memory device or from respective charge pumps internal to the memory devices; and
a processor, which is configured to predict storage activity in the memory devices, and to cause the memory devices to select a source for the operation voltage between the power supply and the respective charge pumps in accordance with the predicted storage activity.

2. The memory controller according to claim 1, wherein the processor is configured to cause a given memory device to select the source by controlling a switch in the given memory device to output a first voltage provided by the power supply or a second voltage generated by a charge pump of the given memory device.

3. The memory controller according to claim 1, wherein the processor is configured to predict the storage activity by evaluating expected durations of imminent transactions between the memory controller and the memory devices, and to cause the memory devices to respectively select the source for the operation voltage based on the expected durations.

4. The memory controller according to claim 3, wherein the processor is configured to cause the memory devices to select the charge pumps when the respective expected durations are shorter than a predefined duration threshold, and to cause the memory devices to select the power supply when the respective expected durations exceed the duration threshold.

5. The memory controller according to claim 1, wherein the interface is further configured to exchange control signaling with the power supply, and wherein the processor is configured to control a power dissipation level in the power supply depending on the predicted storage activity.

6. The memory controller according to claim 5, wherein the processor is configured to control the power dissipation level by shutting down the power supply when the memory devices select the charge pumps.

7. The memory controller according to claim 5, wherein the processor is configured to control the power supply to disconnect a high-power Vpp voltage from the memory devices and to set the power supply to a high-ripple mode of operation in which the power supply consumes a reduced amount of power.

8. The memory controller according to claim 5, wherein the processor is configured to check a switching rate of the power supply resulting from the storage activity, and, when the switching rate exceeds a predefined threshold rate, to operate the power supply in a low-power mode in which the power supply is incapable of driving all the memory devices at full power demand, and to cause one or more of the memory devices to select the charge pumps.

9. The memory controller according to claim 1, wherein the processor is configured to cause a given memory device to select the source based on the predicted storage activity in the given memory device, and independently of the predicted storage activity in other memory devices.

10. The memory controller according to claim 1, wherein the processor is configured to cause a given memory device to select the source based on the predicted storage activity in one or more other memory devices.

11. A method, comprising:
in a controller communicating with one or more memory devices that require an operation voltage, wherein each of the memory devices is capable of obtaining the operation voltage either from a power supply external to the memory device or from respective charge pumps internal to the memory devices, predicting storage activity in the memory devices; and causing the memory devices to select a source for the operation voltage between the power supply and the respective charge pumps in accordance with the predicted storage activity.

12. The method according to claim 11, wherein causing the memory devices to select the source comprises controlling a switch in a given memory device to output a first voltage provided by the power supply or a second voltage generated by a charge pump of the given memory device.

13. The method according to claim 11, wherein predicting the storage activity comprises evaluating expected durations of imminent transactions between the controller and the memory devices, and wherein causing the memory devices to select the source for the operation voltage comprises causing the memory devices to select the source for the operation voltage based on the respective expected durations.

14. The method according to claim 13, wherein causing the memory devices to select the source comprises causing the memory devices to select the charge pumps when the respective expected durations are shorter than a predefined duration threshold, and causing the memory devices to select the power supply when the respective expected durations exceed the duration threshold.

15. The method according to claim 11, and comprising exchanging control signaling with the power supply for controlling a power dissipation level in the power supply depending on the predicted storage activity.

16. The method according to claim 15, wherein controlling the power dissipation level comprises shutting down the power supply when the memory devices select the charge pumps.

17. The method according to claim 15, wherein controlling the power dissipation level comprises controlling the power supply to disconnect a high-power Vpp voltage from the memory devices and setting the power supply to a high-ripple mode of operation in which the power supply consumes a reduced amount of power.

18. The method according to claim 15, wherein controlling the power dissipation level comprises checking a switching rate of the power supply resulting from the storage activity, and, when the switching rate exceeds a predefined threshold rate, operating the power supply in a low-power mode in which the power supply is incapable of driving all the memory devices at full power demand, and causing one or more of the memory devices to select the charge pumps.

19. The method according to claim 11, wherein causing the memory devices to select the source comprises causing a given memory device to select the source based on the predicted storage activity in the given memory device, and independently of the predicted storage activity in other memory devices.

20. The method according to claim 11, wherein causing the memory devices to select the source comprises causing a given memory device to select the source based on the predicted storage activity in one or more other memory devices.

* * * * *